(12) United States Patent
Cheung

(10) Patent No.: US 6,458,673 B1
(45) Date of Patent: Oct. 1, 2002

(54) TRANSPARENT AND CONDUCTIVE ZINC OXIDE FILM WITH LOW GROWTH TEMPERATURE

(75) Inventor: Jeffrey T. Cheung, Thousand Oaks, CA (US)

(73) Assignee: Rockwell Science Center, LLC, Thousand Oaks, CA (US)

( * ) Notice: Subject to any disclaimer, the term of this patent is extended or adjusted under 35 U.S.C. 154(b) by 0 days.

(21) Appl. No.: 09/784,411

(22) Filed: Jan. 16, 2001

Related U.S. Application Data

(62) Division of application No. 09/281,198, filed on Mar. 30, 1999.

(51) Int. Cl.[7] .............................................. H01L 21/20
(52) U.S. Cl. ...................................... 438/479; 438/85
(58) Field of Search ..................... 136/255; 427/586, 427/596; 438/57, 98, 104, 69, 85; 204/192.29

(56) References Cited

U.S. PATENT DOCUMENTS

| | | | |
|---|---|---|---|
| 4,701,592 A | | 10/1987 | Cheung |
| 4,740,386 A | | 4/1988 | Cheung |
| 5,049,405 A | | 9/1991 | Cheung |
| 5,135,581 A | * | 8/1992 | Tran et al. ................. 136/256 |
| 5,397,920 A | * | 3/1995 | Tran et al. ................. 257/749 |
| 5,411,772 A | | 5/1995 | Cheung |
| 5,707,583 A | | 1/1998 | Yodagawa |
| 5,843,341 A | | 12/1998 | Orita et al. |
| 5,990,416 A | | 11/1999 | Windisch, Jr. et al. |

OTHER PUBLICATIONS

Hiramatsu et al, Transaprant condcutingZnO thin films prepared by XeCl ecimer laser baltion., J. Vac.sci.Technol. A 16(2) Mar./Apr. 1998.*

T. Minami, H. Sato, K. Ohashi, T. Tomofuji and S. Takata, "Conduction mechanism of highly conductive and transparent zinc oxide thin films prepared by magnetron sputtering," Journal of Crystal Growth, pp. 370–374, (1992).

Seung Jae Baik, Jae Hoon Jang, Chang Hyun Lee, Woo Yeong Cho and Koeng Su Lim, "Enhancing the characteristics of undoped ZnO films by H2 post treatment using mercury–sensitized photo chemical vapor deposition," Applied Physics Letters (Editor's Office), (Apr. 15, 1996).

Shigemi Kohiki, Mikihiko Nishitani and Takahiro Wada, "Preparation of conductive and transparent thin films by argon ion beam sputtering of zinc oxide in the atmosphere containing hydrogen," Applied Physics Letters (Editor's Office), (Jan. 4, 1994).

Jeffrey T. Cheung and James Waldrop, "In situ etching/growth of ZnO films by pulsed laser deposition," Materials Research Society (Abstract), (1997).

(List continued on next page.)

*Primary Examiner*—Savitri Mulpuri
(74) *Attorney, Agent, or Firm*—Craig E. Shinners

(57) ABSTRACT

The present invention relates to a novel zinc oxide thin film having hydrogen (H) and gallium (Ga) dopants. Advantageously, the activation temperature is low. The co-doped zinc oxide is highly conductive, transparent, chemically stable, easily deposited on a variety of substrates, including flexible or plastic substrates, and is well suited for electrical or optical applications. By co-doping with two impurities, both sides of the zinc oxide lattice contribute to the film conductivity resulting in high electron concentration and high mobility. The co-doped zinc oxide thin film has an increased Fermi level and a reduced work function that is less than 3 eV. The co-doped zinc oxide is crystal clear and transparent even when grown at relatively low processing temperatures. In another preferred embodiment of the present invention, a novel low-temperature activation indium tin oxide (ITO) thin film comprising tin oxide co-doped with indium (In) and hydrogen is disclosed.

12 Claims, 8 Drawing Sheets

OTHER PUBLICATIONS

Jianhua Hu and Roy G. Gordon, "Deposition of Boron Doped Zinc Oxide Films and Their Electrical and Optical Properties," J. Electrochem. Soc., The Electrochemical Society, Inc., vol. 139 (No. 7), pp. 2014–2022, (Jul., 1992).

Jianhua Hu and Roy G. Gordon, "Atmospheric pressure chemical vapor deposition of gallium doped zinc oxide thin films from diethyl zinc, water, and triethyl gallium," J. Appl. Phys,, American Institute of Physics, vol. 72 (No. 11), pp. 5381–5392, (Dec. 1, 1992).

V. Srikant, Valter Sergo, and David R. Clarke, "Epitaxial Aluminum–Doped Zinc Oxide Thin Films on Sapphire: II, Defect Equilibria and Electrical Properties," Journal of the American Ceramic Society, vol. 78, (No. 7), pp. 1935–1939, (Jul., 1995).

B. M. Ataev, A. M. Bagamadova, A. M. Djabrailov, V. V. Mamedow, R. A. Rabadanov, "Highly conductive and transparent Ga–doped epitaxial ZnO films on sapphire by CVD," Thin Solid Films, Elsevier Science S.A., pp. 19–20, (1995).

H. Nanto, T. Minami, S. Shooji, and S. Takata, "Electrical and optical properties of zinc oxide thin films prepared by rf magnetron sputtering for transparent electrode applications," J. Appl. Phys., American Institute of Physics, vol. 55 (No. 4), pp. 1029–1034, (Feb. 15, 1984).

T. Minami, H. Nanto, S. Shooji and S. Takata, "The stability of zinc oxide transparent electrodes fabricated by R. F. magnetron sputtering," Thin Solid Films, Elsevier Sequoia (The Netherlands), pp. 167–174, (1984).

R. Konishi, K. Noda, H. Harada and H. Sasakura, "The preparation of transparent ZnO:Al thin films," Journal of Crystal Growth, Elsevier Science Publishers B.V., pp. 939–942, (1992).

Jianhua Hu and Roy G. Gordon, "Textured fluorine–doped ZnO films by atmospheric pressure chemical vapor deposition and their use in amorphous silicon solar cells," Solar Cells, Elsevier Sequoia (The Netherlands), pp. 437–450, (1991).

Shigemi Kohiki, Mikihiko Nishitani, and Takahiro Wada, "Enhanced electrical conductivity of zinc oxide thin films by ion implementation of gallium, aluminum, and boron atoms," J. Appl. Phys., American Institute of Physics, vol. 75 (No. 4), pp. 2069–2072, (Feb. 15, 1994).

Shigemi Kohiki, Mikihiko Nishitani, Takahiro Wada, and Takashi Hirao, "Enhanced conductivity of zinc oxide thin films by ion implantation of hydrogen atoms," Appl. Phys. Lett., American Institute of Physics, vol. 64, (No. 21), pp. 2876–2878, (May 23, 1994).

Tadatsugu, Hidehito and Shinzo, "Highly Conductive and Transparent Aluminum Doped Zinc Oxide Films Prepared by RF Magnetron Sputtering," Japanese Journal of Applied Physics, vol. 23 (No. 5), pp. L280–L282, (May, 1984).

* cited by examiner

TRANSPARENT AND CONDUCTIVE ZINC OXIDE FILM WITH LOW GROWTH TEMPERATURE

This application is a divisional of copending application: application Ser. No. 09/281,198 filed on Mar. 30, 1999.

BACKGROUND OF THE INVENTION

1. Field of the Invention

The present invention relates to conductive transparent thin films and in particular to a novel chemically stable co-doped zinc oxide material that has a low work function and exhibiting an increase of free electrons in the conduction band.

2. Description of Related Art

The present invention relates to conductive transparent thin films such as zinc oxide. It is well known that pure zinc oxide has low conductivity due to low electron density in the film and makes a poor conductor but, when doped, can exhibit improved electrical and optical properties. Zinc oxide is a common transparent n-type semiconductor material with a wide band gap of about 3.3 eV. Zinc oxide has been used as a thin film electrode in a variety of electrical applications such as solar cells or opto-electronics. It has a resistivity in the range of about $1 \times 10^{-4}$ to $1 \times 10^{-2}$ ohm -cm when doped, may be applied to a substrate using well-known semiconductor processing techniques and is relatively inexpensive when compared to other transparent oxide films such as indium tin oxide (ITO) or tin oxide.

Since zinc is a semiconductor material, researchers have investigated many methods for doping zinc oxide with a wide range of dopants. For example, non-stoichiometric zinc oxide compounds are known to have high conductivity and transmittance but, unfortunately, such compounds are electrically and optically unstable. It is also known that zinc oxide may be doped with Group VII elements such as fluorine or with Group III elements such as boron, aluminum, gallium or indium to obtain improved and stable electrical and optical properties. See for example, Jianhua Hu and Roy G. Gordon, *Atmospheric pressure chemical vapor deposition of gallium doped zinc oxide thin film from diethyl zinc, water, and triethyl gallium*, J. Appl. Phys., Vol. 72, No. 11, 1 December 1992.

Dopants are introduced to the zinc oxide using readily known semiconductor techniques. Such techniques typically require the high processing temperatures associated with semiconductor processing. This high temperature limits the selection of suitable substrates to substrates, such as glass, quartz or silicon, capable of withstanding the processing temperatures. Unfortunately, such substrates are expensive. Accordingly, it is desirable to develop a process that minimizes the processing temperature so that inexpensive plastic or other flexible substrates may be used.

One processing technique that has been used in the past is the ion implantation technique for implanting hydrogen, gallium, aluminum or boron ions at high energy into a zinc oxide film deposited on a glass substrate. It is well known, however, that ion implantation has a tendency to introduce damage to the lattice and create localized dislocations. Thus, an anneal step is also required after ion implantation to minimize the effect of the damage. Although the substrate temperature may be maintained at about 100° C. during the implant process, the zinc oxide is changed from transparent clear to a yellowish-brown color even after annealing. See for example Shigemi Kohiki, Mikihiko Hishitani and Takahiro Wada, *Enhanced electrical conductivity of zinc oxide thin films by. ion implantation of gallium, aluminum, and boron atoms*, J. Appl. Phys., Vol. 75, No. 4, 15 February 1994.

Recent literature has also reported a number of attempts to impart electrical and optical properties to zinc oxide that would be comparable to ITO. By way of example, aluminum-doped zinc oxide thin film grown on sapphire, sputtering in argon (with hydrogen gas) added onto substrates of Corning 7059 glass, boron doped zinc oxide deposited on soda lime and quartz substrates, fluorine-doped zinc films deposited on soda lime glass substrates, argon ion beam sputtering in a hydrogen atmosphere, and ion implantation of gallium, aluminum and boron atoms in an attempt to improve conductivity of zinc oxide thin film. Other research has focused on undoped zinc oxide films having reduced resistivity brought about by treating the film surface with hydrogen in a mercury-sensitive photo-CVD process. Such zinc oxide thin films suffer from a variety of problems such as lacking chemical stability, having a hue other than transparent clear (i.e., yellowish), having poor transmissity and requiring high deposition or activation temperatures.

Growth, or deposition, of the thin film described in the prior art references is typically at a high temperature (between 100° C. to 500° C.) to activate the dopant and make the film conductive. Accordingly, the selection of an appropriate substrate is limited to a glass, quartz or silicon substrate able to withstand such temperatures. Further, subsequent processing may be required to achieve activation of the dopant by heating the film at high temperature after deposition. These high processing temperatures prohibit the use of many inexpensive flexible substrates such as plastic. Further still, while it is possible to obtain high conductivity with an appropriate dopant, the clarity of thin film is often not both clear and transparent. Alternatively, even if crystal clear and transparent, the zinc oxide film is not chemically stable.

Notwithstanding the improvements obtained by the above noted efforts, the processing techniques and the resulting zinc oxide thin film remain less than ideal for many electrical and optical applications. There exists great need for a zinc oxide material that is highly conductive, transparent, chemically stable and easily deposited on a variety of substrates, including flexible or plastic substrates.

As is well known to those skilled in the art, a common transparent conductive material used in many electrical and optical applications is indium tin oxide (ITO). ITO is considerably more expensive than zinc oxide but it has better electrical properties. Unfortunately, ITO also requires high processing temperatures to achieve the desired properties. What is needed is an improved, ITO material that may be activated at lower processing temperatures so that plastic or flexible substrates may be used instead of glass, quartz or silicon substrates.

SUMMARY OF THE INVENTION

The present invention relates to a novel zinc oxide material that is highly conductive, transparent, chemically stable and easily deposited on a variety of substrates, including flexible or plastic substrates, and is well suited for electrical or optical applications. The novel zinc oxide material is co-doped with two dopants, gallium (Ga) and hydrogen (H). A thin film is advantageously grown on a variety of substrates by ablation of a gallium-zinc oxide target in a gaseous hydrocarbon atmosphere. The co-doped zinc oxide thin film is transparent in the visible spectrum, conductive (0.9 to $3 \times 10^{-4}$ ohm-cm), has chemical and thermal stability and has a work function between 2.0 eV to 3.0 eV.

In one preferred embodiment, a sintered cylindrical-shaped target comprising a mixture of gallium and zinc oxide is positioned in a deposition chamber. The chamber atmosphere contains a mixture of oxygen-enriched atmosphere and a gaseous hydrocarbon such as methane, propane or ethane. The co-doped zinc oxide thin film is deposited using a pulsed laser deposition process although it is possible to use other deposition processes such as, by way of example, sputtering.

The co-doping of the zinc oxide with both gallium and hydrogen has significant advantages. Specifically, activation of the dopants at low growth temperature achieves a conductive and transparent zinc oxide film that can be deposited on a variety of substrates. The activation temperature is important since it is the minimum temperature to correctly position dopant atoms at the correct location in the lattice. As will be appreciated, a low deposition temperature typically leaves a very high percentage of the dopant atoms (i.e., gallium atoms) at interstitial locations of the lattice where such atoms do not contribute to the electron concentration or mobility. In such instances (e.g. prior art zinc oxide films), a high temperature anneal is required to replace the zinc atoms in the lattice with the gallium atoms. However, no such high temperature anneal is necessary to activate the dopant in the present invention since activation occurs even at low deposition temperatures. Further, the hydrogen atoms are incorporated into the zinc oxide most likely attached to the oxygen atoms. Every gallium atom in the lattice can stabilize at least one hydrogen atoms in the lattice. Advantageously, the high concentration of hydrogen does not disturb the lattice structure because of the small size of the hydrogen.

In the lattice of zinc oxide, a dopant can replace either a zinc atom or an oxygen atom. However, by co-doping with gallium and hydrogen, a gallium atom will replace a percentage of the zinc atoms in the lattice and the hydrogen appears to be absorbed on the oxygen side. Thus, by co-doping with two impurities, both sides of the lattice can contribute to the film conductivity. The result is a co-doped zinc oxide thin film with high electron concentration and high mobility compared to zinc oxide doped with a single dopant. Further, the high electron concentration of the co-doped zinc oxide thin film lifts the Fermi level to above the conduction band edge by an energy amount known as the Burnstein-Moss shift. Further still, the co-doped zinc oxide has a reduced work function that is less than 3 eV (more specifically, between 2 eV and 3 eV). Further still, the co-doped zinc oxide is crystal clear and transparent in the visible spectrum even when grown at relatively low processing temperatures (i.e., between about 30° C. to 170° C.).

In another preferred embodiment of the present invention, a novel indium tin oxide (ITO) thin film has the necessary electrical and optical properties that are obtained at low processing temperatures sufficient to permit the use of plastic or flexible substrates. The novel ITO comprises tin oxide co-doped with indium (In) and hydrogen.

Additional advantages to the present invention become apparent upon reading and understanding this specification.

BRIEF DESCRIPTION OF THE DRAWINGS

For a more complete understanding of the present invention, the following Detailed Description of the Preferred Embodiments makes reference to the accompanying Drawings in which.

DETAILED DESCRIPTION OF THE PREFERRED EMBODIMENTS

In the following description of the preferred embodiment, reference is made to the accompanying drawings, which form a part hereof, and in which is shown by way of illustration specific embodiments in which the invention may be practiced. In the following description, numerous specific details are set forth in order to provide a through understanding of the present invention. It will be apparent, however, to one skilled in the art that the present invention may be practiced without these specific details. In other instances, well-known structures and techniques are not shown or discussed in detail in order to avoid unnecessarily obscuring the present invention.

Figure 1:
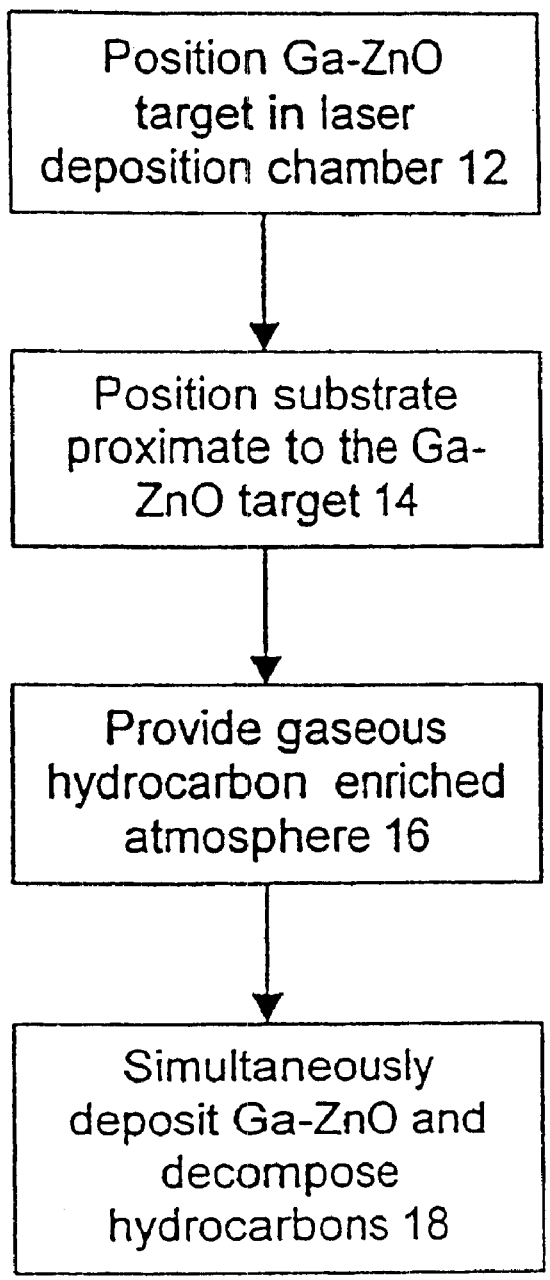
FIG. 1 is a process flow diagram illustrating a method for manufacturing the co-doped zinc oxide of the present invention.

Referring now to FIG. 1, one illustrative process for growing the novel zinc-oxide thin film is shown. The zinc oxide film is grown using readily available semiconductor processing techniques. Specifically, as indicated at steps 12 and 14, a gallium-zinc oxide target is positioned proximate to a substrate (not shown) in a deposition chamber (not shown). The chamber is evacuated and an oxygen rich atmosphere of gaseous hydrocarbon is introduced as indicated at step 16. Using a selected deposition technique, a thin film of co-doped zinc oxide is deposited on the substrate as indicated at step 18. The essential components of pulsed laser deposition methods are disclosed in U.S. Pat. No. 5,411,772 which issued May 2, 1995 to Jeffery T. Cheung the present inventor, the disclosure of which is incorporated herein by reference.

The target is preferably selected from targets having a gallium concentration of between 0.2 atomic wt % to 2.0 atomic wt %. It should be understood that the actual concentration depends on each particular application of the thin film. Initial experimentation indicates that a concentration of gallium in the resulting thin film of between about 0.5 atomic wt % and 1.5 atomic wt % is preferred for most applications. However, it is believed that higher concentrations of between about 1.5 atomic wt % (preferred) to about 2.0 atomic wt % gallium will maximize the concentration of mobile electrons. One preferred target, a cylindrical target, is disclosed in U.S. Pat. No. 4,740,386, which issued Apr. 26, 1986 to Jeffery T. Cheung the present inventor. Specifically, this reference teaches the use of a cylindrical target that is rotated and simultaneously translated along a longitudinal axis in the presence of a laser beam to provide a controlled and uniform film deposition over a substrate. Alternatively, a sintered disk-shaped target or a powdered mixture of gallium and zinc oxide may be used in place of the cylindrical target.

During deposition of the zinc oxide thin film, methane ($CH_4$) gas is added to an oxygen-rich atmosphere in the deposition chamber as a source of hydrogen atoms. In one preferred embodiment, the ratio of oxygen to methane is between about 4:1 and 10:1 at 30 milliTorr. Other gaseous hydrocarbons, such as propane or ethane, may be selected as the source of hydrogen atoms. Alternatively, other sources of hydrogen, other than water ($H_2O$), which is difficult to implement in a vacuum, may be selected, it only being required that free hydrogen is available during the deposition process.

In one preferred ablation process, a pulsed laser controllably vaporizes the target during the deposition process. The laser ablation induced plasma decomposes the methane to form hydrogen atoms. It will be appreciated, however, that other known deposition techniques may be readily employed to obtain the co-doped zinc oxide thin film. Magnetron Sputtering, Plasma Assisted CVD, and Activated Reactive Evaporation are listed as examples. Plasma Assisted CVD is preferred if the size of the substrate would otherwise preclude the use of a vacuum chamber. Advantageously, the substrate temperature for growth of the zinc oxide thin film is maintained in the range of between 30° C. and 250° C. but preferably below 180° C.

Table 1 shows representative sheet resistance and light transmission measurements for samples of a 2,000-Angstrom thick thin film of co-doped zinc oxide film grown at selected temperatures. The resistivity of the co-doped zinc oxide thin film can be in the range of 1.0 to $4.0 \times 10^{-4}$ ohm-cm. Those skilled in the art familiar with prior art zinc oxide film will appreciate that with just hydrogen or a Group III element as a dopant, the film tends to have a yellowish hue unless grown at a very high (5000) temperatures. In contrast, the co-doped zinc oxide thin film is remarkably clear and transparent regardless of growth temperature.

TABLE 1

| Thin Film Growth Temperature (° C.) | Typical Sheet Resistance (Ω/□) | Light Transmittance (visible spectral region incident on glass substrate) |
|---|---|---|
| 175 | 5 | 88% to 90% |
| 108 | 11 | 84% |
| 78 | 15 | 82% |
| 37 | 20 | 79% |

As indicated in Table 1, the electrical parameters of the thin film of the co-doped zinc oxide is correlated to deposition temperature but even at a very low deposition temperature the sheet resistance is sufficient for many electronic applications. By way of comparison to prior art zinc oxide thin films, a thin film of gallium doped zinc oxide (but with no hydrogen doping) has a sheet resistance that ranges from about 11,000Ω/□ for a deposition temperature of 200° C. and a film thickness is 5,600 Angstroms—to about 3.6Ω/□ for a deposition temperature of 470° C. and a film thickness of 6,600 Angstroms. The co-doped zinc oxide thin film is conductive (1.0 to $4.0 \times 10^{-4}$ ohm-cm). When the deposition temperature of the present zinc oxide is minimized (i.e., in a range of about 30° C. to 100° C.), the zinc oxide thin film may be deposited on a wide range of inexpensive low-temperature substrates such as plastic or other flexible substrates. Thus, the deposition of zinc oxide thin film is no longer restricted to deposition on substrate materials such as glass, quartz, silicon or expensive high-temperature plastic substrates (that is, able to withstand deposition temperatures in excess of 100° C.).

With the present invention, the zinc oxide film has a high concentration of electrons in the range of $10^{16}$ to about $5.2 \times 10^{20}$ $cm^{-3}$, exhibiting high mobility. The novel zinc oxide thin film has low electrical resistance where resistance is a function of electron mobility. It will be appreciated that electrons should be as mobile as possible since the product of mobility times the carrier concentration defines the resistivity of the film. Experimental evaluation of the thin film indicates that at a 175° C. deposition temperature, the mobility is about 30 $cm^2$V-second for a concentration of about 0.5 atomic wt. % for gallium.

In the co-doped zinc oxide, activation occurs at low temperature. The term "activation" means that the impurity atoms (gallium and hydrogen) occupy positions in the lattice and become electrically active (that is, rapidly react to the application of a stimulus such as an applied voltage). In comparison, it is not uncommon of a large percentage of the dopant in the prior art film to remain inactive (that is they do not occupy a lattice site) even with high process or activation temperatures. In the zinc oxide film of the present invention, the low temperature activation is believed due, at least in part, to substitution of zinc atom with gallium atoms in the zinc oxide lattice and attachment of the hydrogen atoms with oxygen to form O—H bonds so that both sides of the lattice contribute electrons. Advantageously, each gallium atom in the lattice is capable of stabilizing at least one hydrogen atom.

Each hydrogen atom most likely attaches to an oxygen atom to form a hydroxyl group that acts as a donor (n-type) impurity. The hydrogen dopant in the zinc oxide lattice is stabilized by the presence of gallium so there are no mobile hydrogen ions in the thin film. With the hydrogen bound in the lattice, the electrical properties of the film are very stable even at elevated operating temperatures. Accordingly, the film does not readily form an oxidized (insulating) surface layer and does not react with other components of the electrical or optical system in which the film is used.

Figure 2:
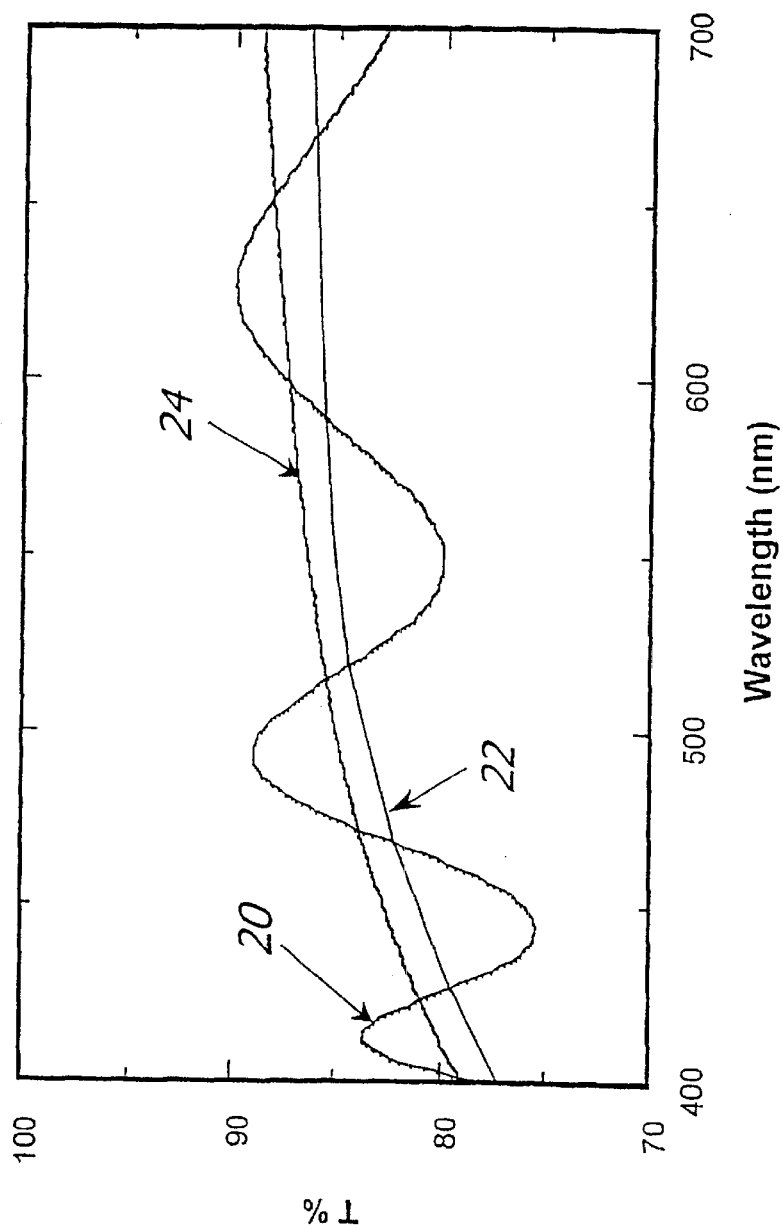
FIG. 2 illustrates typical transmittance of a thin film of the novel co-doped zinc oxide of the present invention.

FIG. 2 illustrates the transmittance, an important optical property for many applications, of the co-doped zinc oxide film in a portion of the visible spectrum. A 5,500-Angstrom thick thin film of co-doped zinc oxide was deposited on a glass substrate and the incident light transmitted through the film is measured and plotted at 20. An interference pattern is due to the thickness of the thin film but an approximate average transmittance, as indicated by line 22, is shown. For this sample, deposited at a substrate temperature of 150° C., the average transmission of incident visible radiation ranges from 77% for shorter wavelengths to about 85% for longer wavelengths. For purposes of comparison, measurements for an ITO thin film of about 1,000 Angstrom with the same resistivity as the co-doped zinc oxide is shown at line 24. For purpose of further comparison, a 3,000-Angstrom thick thin film of ITO has an average transmittance in the visible spectrum of about 80% as reported in the literature. Clearly, the co-doped zinc oxide thin film is more transparent than a comparable ITO thin film.

Figure 3:
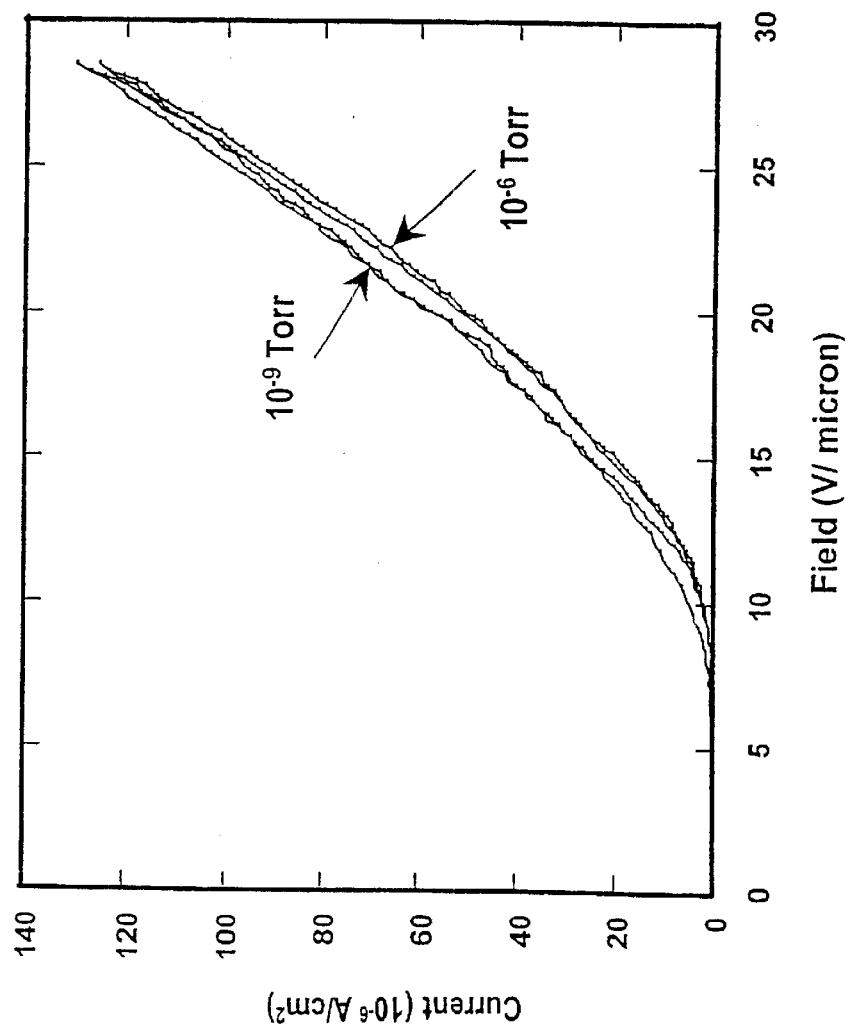
FIG. 3 illustrates the chemical stability of the novel co-doped zinc oxide of the present invention.

FIG. 3 illustrates the chemical stability and high electron field emission efficiency of the co-doped zinc oxide in a vacuum. The electron-field emission from a co-doped zinc oxide film is relatively independent of vacuum level indicating that the oxide does not readily form an insulating oxide layer. In one experiment, a field potential of between 5 and 30 volts per $10^{-4}$ cm is applied across a thin film sample of the zinc oxide film electrically connected to a ground potential and an electrode separated from the film by a vacuum gap of about $1.0 \times 10^{-6}$ meters. The emission current density is then measured for various vacuum levels. As shown in FIG. 3, the current density does not vary substantially even as the vacuum level is varied between $10^{-9}$ Torr to $10^{-6}$ Torr. In the prior art material, there is substantial emission current density degradation as the vacuum is varied.

Figure 4A:
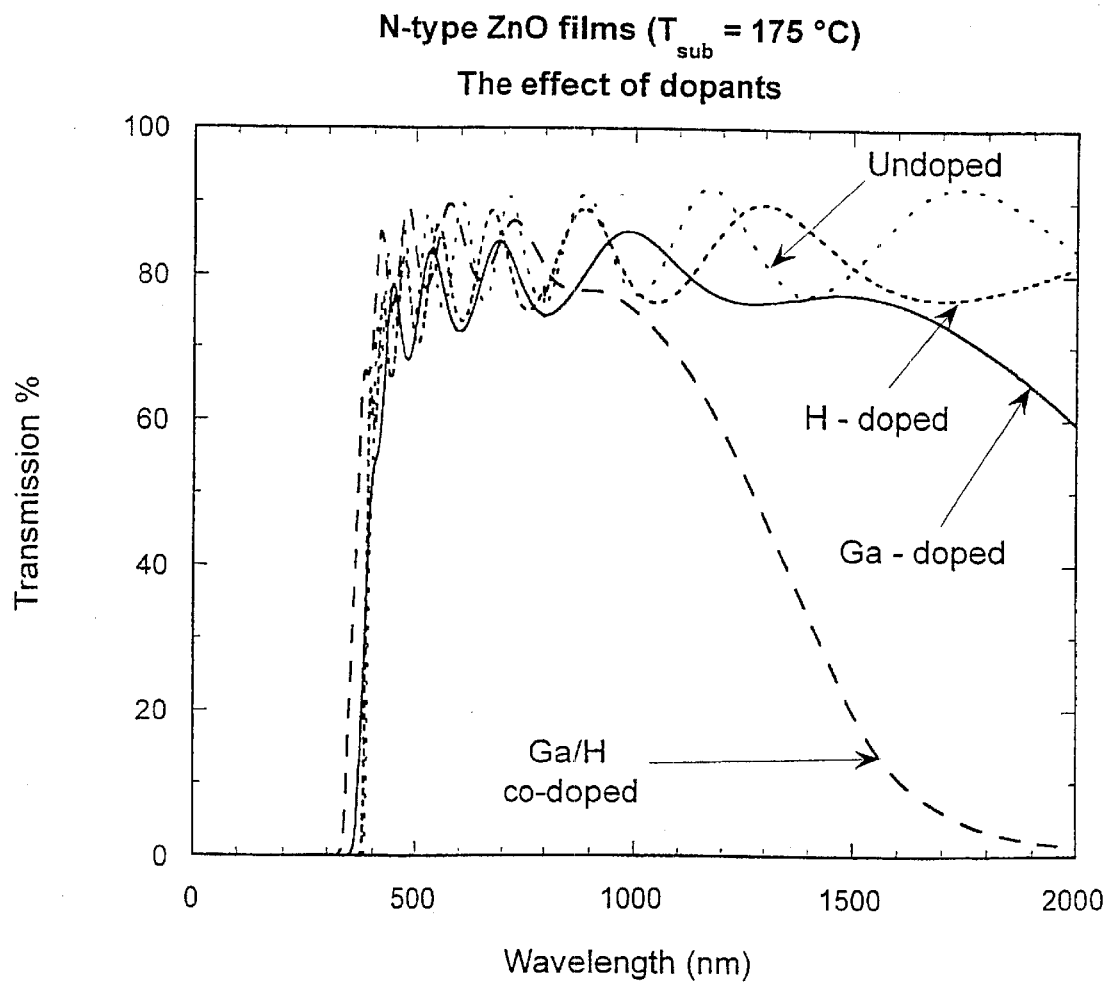
FIGS. 4A and 4B illustrate the transmission spectra of novel co-doped zinc oxide films grown at selected temperatures.
Figure 4B:
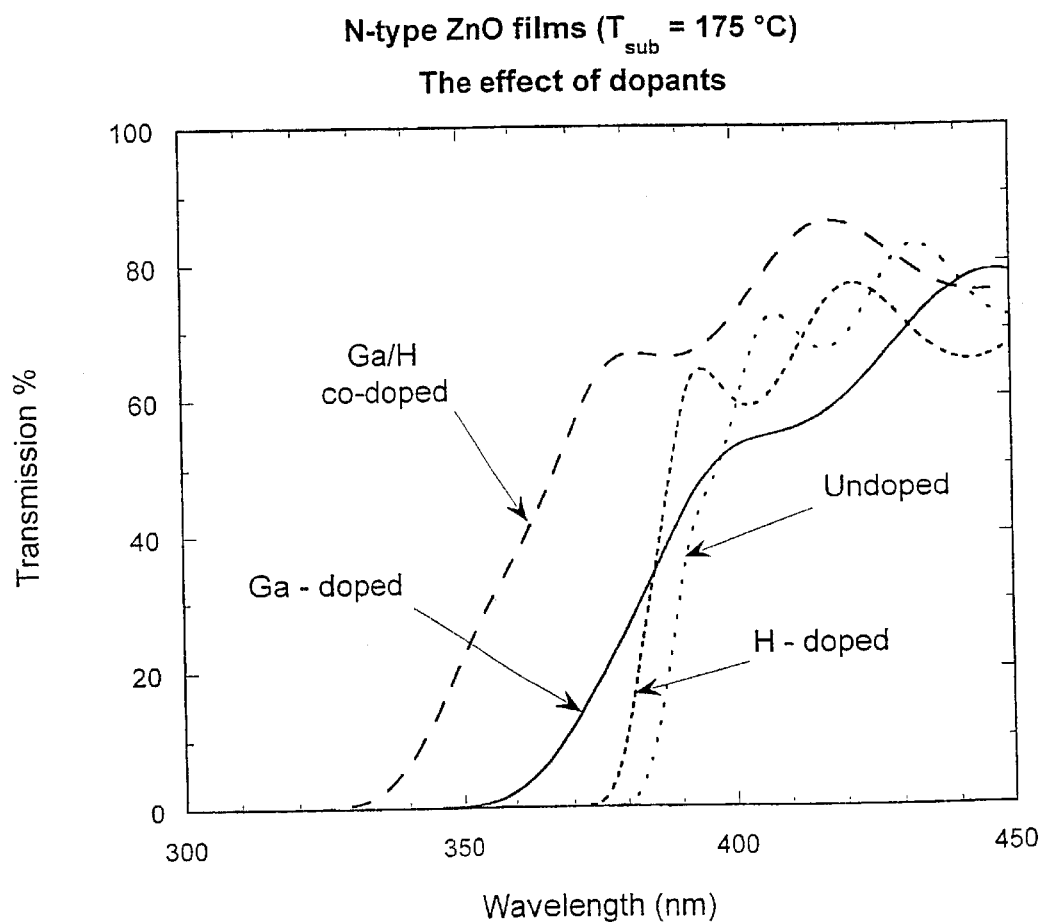
Figure 4C:
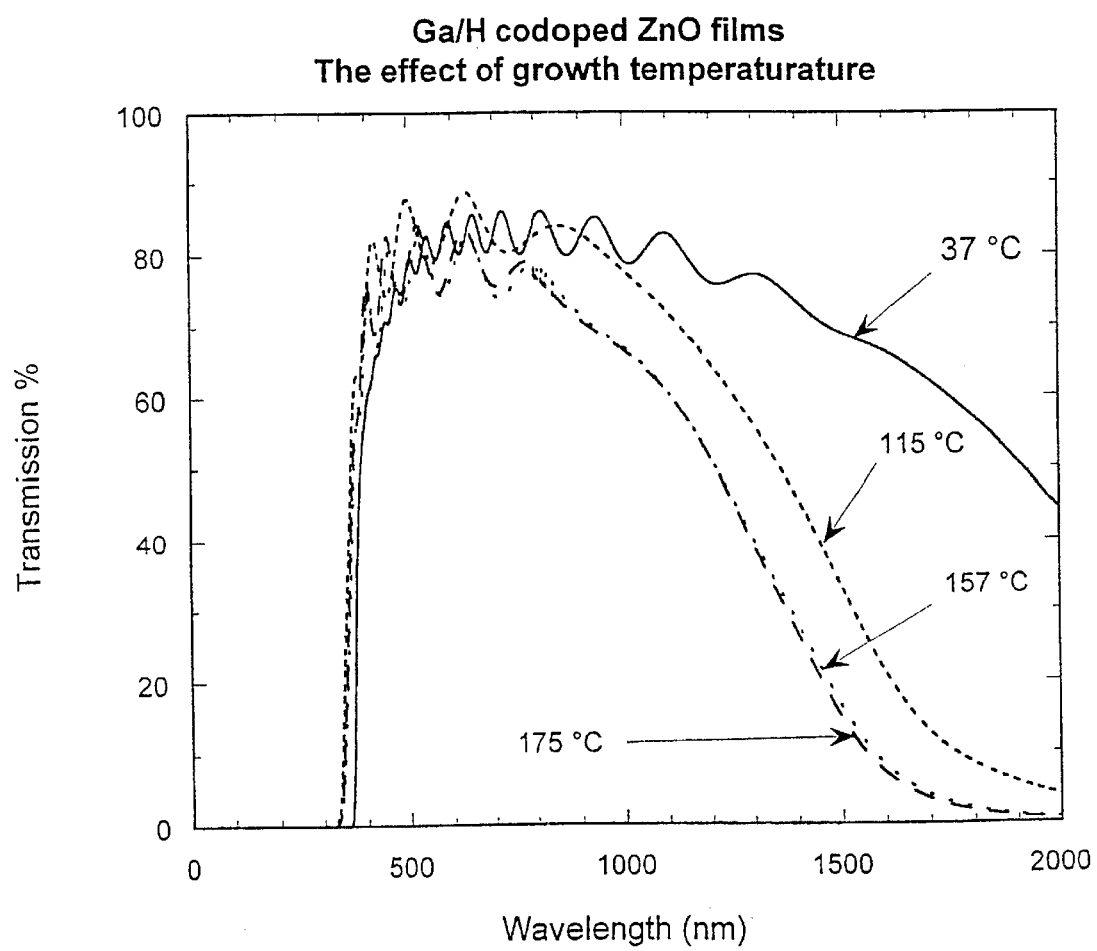
FIGS. 4C–4D illustrate the transmission spectra of four zinc oxide films having various dopants.
Figure 4D:
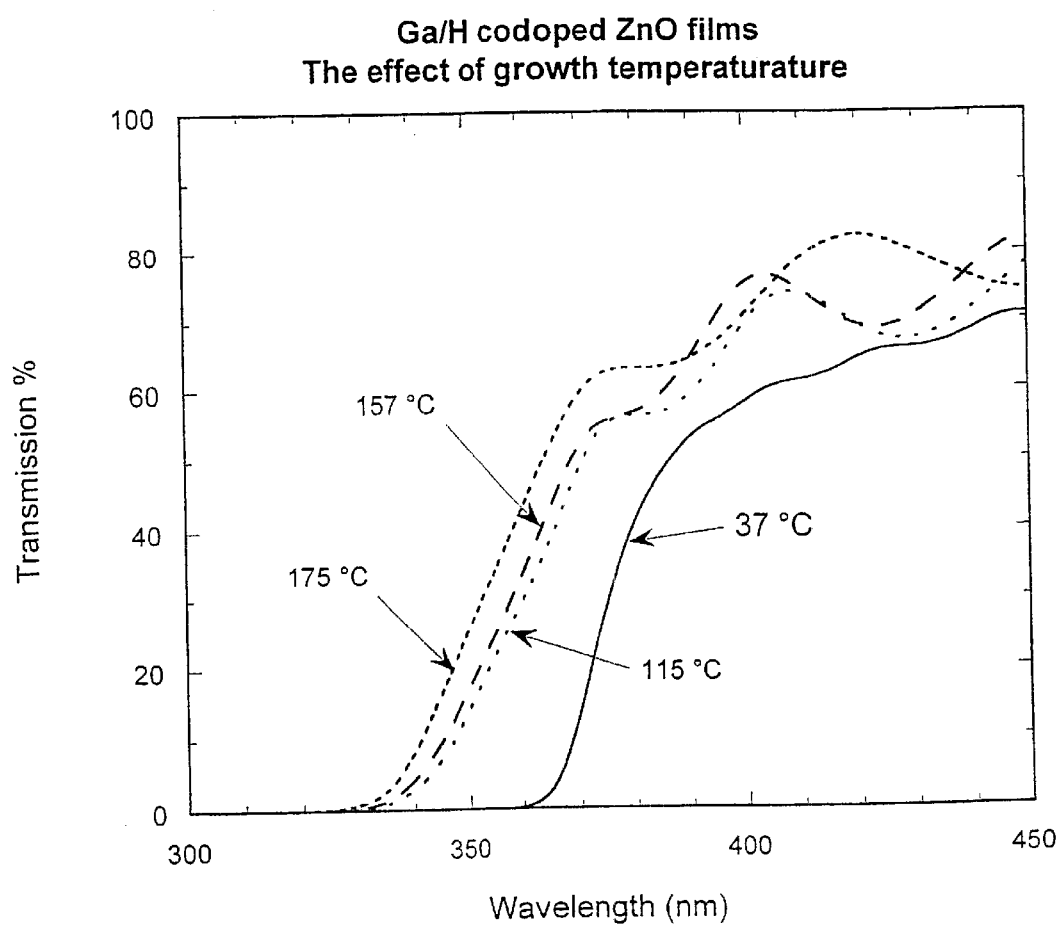

Referring now to FIGS. 4A–4D, the optical transmission spectra of the co-doped zinc oxide is illustrated at selected temperatures. As illustrated in FIG. 4A, a significant monotonic decrease in transmission of light through the thin film of co-doped zinc oxide is shown at longer wavelengths. This decrease is due to free carrier absorption that occurs when electron concentration is high enough to provide electrons in the conduction band. The amount of free carrier absorption for a co-doped zinc oxide is higher than zinc oxide with a single dopant of either gallium or hydrogen grown at a temperature of 175° C. Even if the co-doped zinc oxide film of the present invention is grown at near-room temperature, the free carrier concentration is dominant. In undoped zinc oxide, the electron carrier concentration is relatively low (this is known as the intrinsic level) and there is no free carrier absorption. In contrast to the co-doped zinc oxide, light transmission remains high for the visible to infrared sprecta for undoped zinc oxide, as shown in FIG. 4D. This phenomenon is also shown for zinc oxide doped with either hydrogen or gallium, which also have low electron carrier concentration.

In FIG. 4B, a shift of absorption edge is shown at shorter wavelengths. This shift is known as the Burnstein-Moss shift (the energy difference between the absorption edges of doped and undoped sample) is due to the filling of electrons in the conduction band. Even at a growth temperature of 37° C. there is a significant Burnstein-Moss shift compared to undoped zinc oxide or zinc oxide with a single dopant. The presence of the large Burnstein-Moss shift in the co-doped zinc oxide is critical to achieving the low work function, since the work function is the difference between the electron affinity (typically between 3.4 eV and 2.6 eV for zinc oxide) and the Burnstein-Moss shift. Electron affinity is the energy difference between the vacuum energy level and the conduction band edge of the specific material. Gallium and hydrogen co-doped zinc oxide shows the larger Burnstein-Moss shift compared to zinc oxide doped with a single dopant of either gallium or hydrogen grown under the similar conditions.

FIG. 4C illustrates the effect of depositing films having different dopants at a high temperature (for example, at 175° C.). The Burnstein-Moss shift for the co-doped zinc oxide of the present invention is significant compared to undoped zinc oxide, gallium-doped zinc oxide and hydrogen-doped zinc oxide. The free carrier absorption and the magnitude of the Burnstein-Moss shift shown in FIGS. 4C and 4D clearly illustrates the substantial difference achieved by the co-doping process and the co-doped zinc oxide thin film of the present invention.

Figures 5A, 5B:
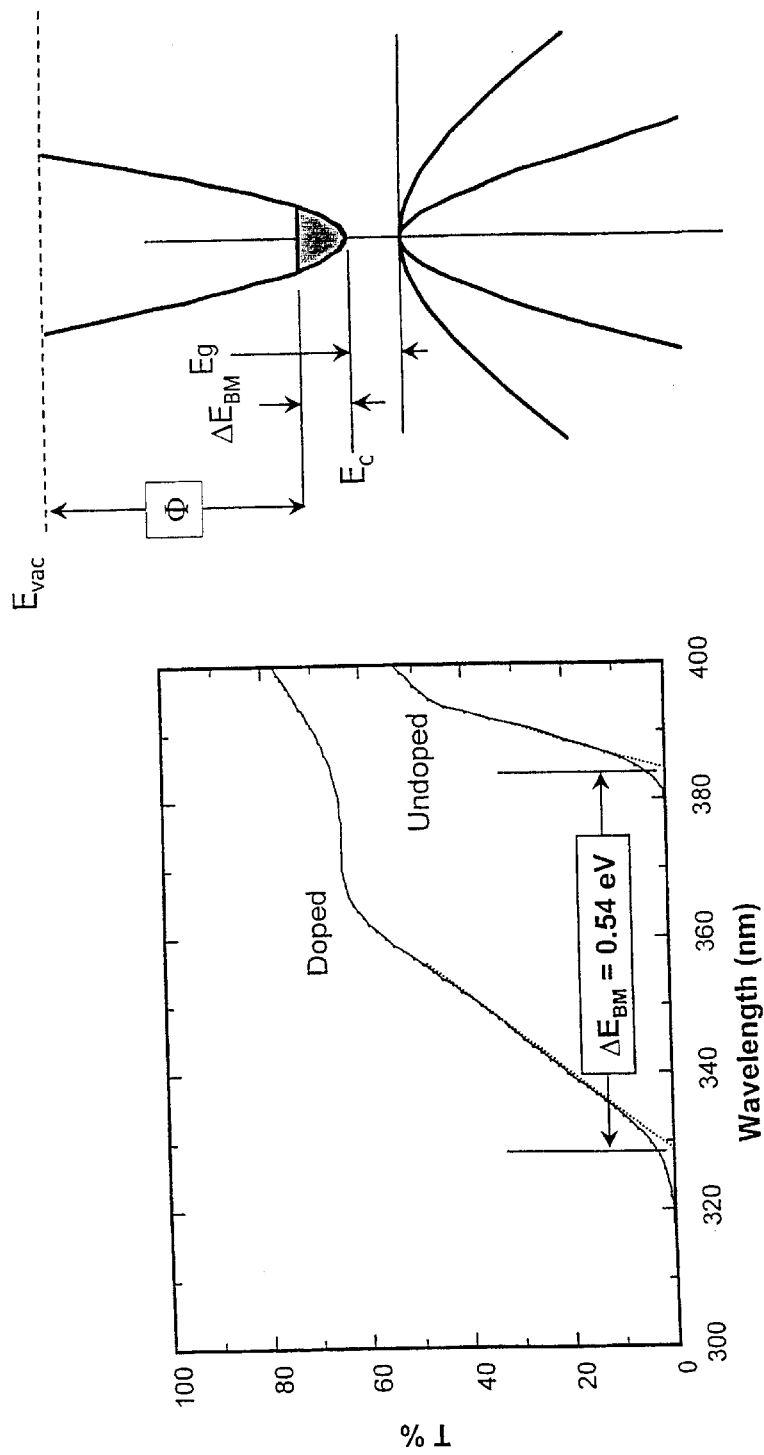
FIGS. 5A–5B graphically illustrate the Burnstein-Moss shift of the novel zinc oxide thin film of the present invention.

Referring now to FIGS. 5A and 5B, the relationship between the Burnstein-Moss shift and the work function is shown in detail. In FIG. 5A, the Burnstein-Moss shift ($\Delta E_{BM}$) is shown, with respect to undoped and co-doped zinc oxide, as being about 0.54 eV. The Burnstein-Moss shift is also shown in FIG. 5B. In the co-doped zinc oxide excess mobile electrons are present in the conduction band so its Fermi level ($E_f$) is lifted to be above the conduction band edge ($E_c$) by an amount equal to the Burnstein-Moss shift. These mobile electrons require less energy to escape the material by field emission process and accordingly, a lower work function ($\Phi$). The phrase "work function" refers to the minimum energy needed by an electron to escape to the vacuum from the attractive forces that normally bind the electron to the zinc oxide material. More specifically, the work function may be thought of as the energy difference of an electron in a vacuum and the Fermi level, which is the highest energy level of an electron in the solid zinc oxide. The work function of the co-doped zinc oxide is estimated to be about 2 eV to 3 eV.. This estimate is obtained from theoretical considerations and indirect observation of work function refraction due to Burnstein-Moss shift in co-doped zinc oxide compared to undoped zinc oxide.

In yet another preferred embodiment, a novel ITO thin film is disclosed. In this embodiment, anode 14 comprises a thin film of indium oxide having two dopants. More particularly the indium oxide is doped with both tin (Sn) and hydrogen (H). As in the deposition process described above for the co-doped zinc oxide, the indium oxide thin film is deposited on a suitable substrate by pulsed laser deposition or other suitable deposition process with a tin-indium-oxide target and a gaseous hydrocarbon (such as methane by way of example) rich atmosphere. During deposition, the methane decomposes to free hydrogen atoms while tin atoms are supplied from vaporization of the target. The concentration of tin in the co-doped indium oxide thin film may be readily varied for specific engineering applications. By co-doping, free electron concentration and mobility is increased in the indium oxide thin film. Advantageously, the co-doped indium oxide material may be grown at a low temperature with less tin content than used in prior art oxides. That is, the co-doped tin oxide of the present invention is grown with less than 5 atomic wt % tin, and preferably between 0.5 atomic wt % to 2 atomic wt % tin rather than about 9% as is typical in prior art ITO.

While certain exemplary preferred embodiments have been described and shown in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed.

I claim:

1. An improved deposition process for growing co-doped zinc oxide thin film having a low growth temperature for dopant activation comprising the steps of:

providing a zinc oxide target having at least one impurity comprising about 1.5 atomic wt % of gallium, maintaining a substrate at a selected temperature;

providing a mixture of oxygen and gaseous hydrocarbons between said target and said substrate, said mixture comprising about four parts oxygen and one part hydrocarbon; and deposit, by deposition means, a thin film of co-doped zinc oxide on said substrate.

2. The process of claim 1 wherein said deposition means comprises a pulsed laser deposition chamber where a hydrogen dopant of said co-doped zinc oxide is provided from the decomposition of said gaseous hydrocarbon, said gaseous hydrocarbon obtained from a group comprising ethane, methane or propane; said pulsed laser operated to controllably vaporize said target and decompose said gaseous hydrocarbon while maintaining said substrate at a selected temperature within the range of 35° C. and 200° C.

3. The process of claim 2 wherein said mixture is maintained at a atmospheric pressure of about 30 milliTorr.

4. The process of claim 1 wherein said zinc oxide target comprises a sintered cylindrical-shaped target positioned in said deposition chamber.

5. The process of claim 1 wherein said thin film of co-doped zinc oxide deposited on said substrate comprises gallium and hydrogen dopants occupying electrically active positions in the lattice of said zinc oxide deposited on said substrate.

6. An improved deposition process for growing co-doped zinc oxide thin film having a low growth and dopant activation temperature comprising the steps of:

provit a zinc oxide target having am impurity of between 0.2 atomic wt % and 2 atomic wt % of gallium;

maintaining a substrate at a selected temperature below than 200° C.;

providing a mixture of oxygen and gaseous hydrocarbons between said target and said substrate, said mixture comprising about four parts oxygen and one part gaseous hydrocarbons selected from the following: ethane, propane or methane; and depositing, by deposition means, a thin film of co-doped zinc oxide on said substrate.

7. The process of claim 6 wherein said depositing step comprises pulsed laser deposition to decompose said gaseous hydrocarbon and vaporize said target.

8. The process of claim 7 wherein said target comprises a sintered cylindrical-shaped target positioned in said deposition chamber.

9. The process of claim 7 wherein said mixture is maintained at an atmospheric pressure of about 30 milliTorr.

10. The process of claim 9 wherein said substrate temperature is maintained at a selected temperature below 50 ° C. during deposition of said thin film.

11. The process of claim 9 wherein said substrate temperature is maintained at a selected temperature of about 35 ° C. during deposition of said thin film.

12. The process of claim 11 wherein said thin film of co-doped zinc oxide deposited on said substrate comprises gallium and hydrogen dopants occupying electrically active positions in the lattice of said zinc oxide.

* * * * *